(12) United States Patent
Baeckler et al.

(10) Patent No.: US 7,565,388 B1
(45) Date of Patent: Jul. 21, 2009

(54) LOGIC CELL SUPPORTING ADDITION OF THREE BINARY WORDS

(75) Inventors: Gregg Baeckler, San Jose, CA (US); Martin Langhammer, Salisbury (GB); James Schleicher, Santa Clara, CA (US); Richard Yuan, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 865 days.

(21) Appl. No.: 10/718,968

(22) Filed: Nov. 21, 2003

(51) Int. Cl.
*G06F 7/38* (2006.01)
*G06F 7/50* (2006.01)

(52) U.S. Cl. ...................................... 708/235; 708/709

(58) Field of Classification Search .................. 708/700, 708/709, 235, 708
See application file for complete search history.

(56) References Cited

U.S. PATENT DOCUMENTS

| | | | |
|---|---|---|---|
| 5,260,610 A | 11/1993 | Pedersen et al. |
| 5,260,611 A | 11/1993 | Cliff et al. |
| 5,274,581 A | 12/1993 | Cliff et al. |
| 5,295,090 A | 3/1994 | Hsieh et al. |
| 5,349,250 A | 9/1994 | New |
| 5,359,242 A | 10/1994 | Veenstra |
| 5,359,468 A | 10/1994 | Rhodes et al. |
| 5,365,125 A | 11/1994 | Goetting et al. |
| 5,436,575 A | 7/1995 | Pedersen et al. |
| 5,481,206 A | 1/1996 | New et al. |
| 5,481,486 A | 1/1996 | Cliff et al. |
| 5,483,478 A | 1/1996 | Chiang |
| 5,485,103 A | 1/1996 | Pedersen et al. |
| 5,488,316 A | 1/1996 | Freeman et al. |
| 5,500,608 A | 3/1996 | Goetting et al. |
| 5,523,963 A | 6/1996 | Hsieh et al. |
| 5,546,018 A | 8/1996 | New et al. |
| 5,629,886 A | 5/1997 | New |
| 5,631,576 A | 5/1997 | Lee et al. |
| 5,672,985 A | 9/1997 | Lee |
| 5,675,262 A | 10/1997 | Duong et al. |

(Continued)

OTHER PUBLICATIONS

Ahmed, Elias et al.; "The Effect of LUT and Cluster Size on Deep-Submicron FPGA Performance and Density"; 2000, FPGA, pp. 3-12.

(Continued)

*Primary Examiner*—Chuong D Ngo
(74) *Attorney, Agent, or Firm*—Townsend and Townsend and Crew LLP

(57) ABSTRACT

Logic circuits that support the addition of three binary numbers using hardwired adders are described. In one embodiment, this is accomplished by using a 3:2 compressor (i.e., a Carry Save Adder method), using hardwired adders to add the sums and carrys produced by the 3:2 compression, and sharing carrys data calculated in one logic element ("LE") with the following LE. In such an embodiment, with the exception of the first and last LEs in a logic array block ("LAB"), each LE in effect lends one look-up table ("LUT") to the LE below (i.e., the following LE) and borrows one LUT from the LE above (i.e., the previous LE). The LUT being lent or borrowed is one that implements the carry function in the 3:2 compressor model. In another aspect, an embodiment of the present invention provides LEs that include selectors to select signals corresponding to the addition of three binary numbers mode.

26 Claims, 6 Drawing Sheets

U.S. PATENT DOCUMENTS

| | | | |
|---|---|---|---|
| 5,724,276 | A | 3/1998 | Rose et al. |
| 5,761,099 | A | 6/1998 | Pedersen |
| 5,764,557 | A * | 6/1998 | Hara et al. ............... 708/603 |
| 5,818,255 | A | 10/1998 | New et al. |
| 5,889,411 | A | 3/1999 | Chaudhary |
| 5,898,319 | A | 4/1999 | New |
| 5,898,602 | A | 4/1999 | Rothman et al. |
| 5,909,126 | A | 6/1999 | Cliff et al. |
| 5,999,016 | A | 12/1999 | McClintock et al. |
| 6,021,423 | A | 2/2000 | Nag et al. |
| 6,051,992 | A | 4/2000 | Young et al. |
| 6,107,827 | A | 8/2000 | Young et al. |
| 6,118,300 | A | 9/2000 | Wittig et al. |
| 6,154,052 | A | 11/2000 | New |
| 6,154,053 | A | 11/2000 | New |
| 6,154,055 | A | 11/2000 | Cliff et al. |
| 6,157,209 | A | 12/2000 | McGettigan |
| 6,191,610 | B1 | 2/2001 | Wittig et al. |
| 6,191,611 | B1 | 2/2001 | Altaf |
| 6,288,568 | B1 | 9/2001 | Bauer et al. |
| 6,288,570 | B1 | 9/2001 | New |
| 6,297,665 | B1 | 10/2001 | Bauer et al. |
| 6,323,682 | B1 | 11/2001 | Bauer et al. |
| 6,400,180 | B2 | 6/2002 | Wittig et al. |
| 6,501,296 | B2 | 12/2002 | Wittig et al. |

OTHER PUBLICATIONS

Baeckler, Gregg; "Altera Raphael Device Family: Modification to Scheme 7 for Adding 3 numbers"; 2002, 14 pages.

Cherepacha, Don et al.; "DP-FPGA Architecture Optimized for Datapaths"; 1996, VLSI Design, vol. 4, No. 4, pp. 329-343.

Kaptanoglu, Sinan et al.; "A new high density and very low cost reprogrammable FPGA architecture"; 1999, FPGA, pp. 3-12.

Kouloheris, Jack L. et al.; "FPGA Area versus Cell Granularity—Lookup Tables and PLA Cells"; 1992, FPGA, pp. 9-14.

Rose, Jonathan et al.; "Architecture of Field-Programmable Gate Arrays: The Effect of Logic Block Functionality on Area Efficiency"; 1990, IEEE Journal of Solid-State Circuits, vol. 25, No. 5, pp. 1217-1225.

Computer Arithmetic: A.2: Basic Techniques of Integer Arithmetic, 4 pages.

"FLEX 8000, Programmable Logic Device Family"; 1999, Altera Version 10.01, pp. 349-364.

"FLEX 10K, Embedded Programmable Logic Device Family"; 2001, Altera Version 4.1, pp. 1-28.

"FLEX 6000, Programmable Logic Device Family"; 2001, Altera Version 4.1, pp. 1-17.

"Mercury, Programmable Logic Device Family"; 2002, Altera Version 2.0, pp. 1-34.

"APEX 20K, Programmable Logic Device Family"; 2002, Altera Version 4.3, pp. 1-29.

"Stratix FPGA Family"; 2002, Altera Version 3.0, pp. 1-19.

"Virtex-II OPlatform FPGAs: Detailed Description"; 2002, Xilinx, Version 2.1.1, pp. 1-40.

"ORCA Series 2 Field-Programmable Gate Arrays"; 2003, Lattice Semiconductor Corporation, pp. 1-26.

* cited by examiner

LOGIC CELL SUPPORTING ADDITION OF THREE BINARY WORDS

BACKGROUND OF THE INVENTION

Programmable logic devices ("PLDs") (also sometimes referred to as complex PLDs ("CPLDs"), programmable array logic ("PALs"), programmable logic arrays ("PLAs"), field PLAs ("FPLAs"), erasable PLDs ("EPLDs"), electrically erasable PLDs ("EEPLDs"), logic cell arrays ("LCAs"), field programmable gate arrays ("FPGAs"), or by other names), are well-known integrated circuits that provide the advantages of fixed integrated circuits with the flexibility of custom integrated circuits. Such devices typically provide an "off the shelf" device having at least a portion that can be programmed to meet a user's specific needs. Application specific integrated circuits ("ASICs") have traditionally been fixed integrated circuits. However, it is possible to provide an ASIC that has a portion or portions that are programmable. Thus, it is possible for an integrated circuit device to have qualities of both an ASIC and a PLD. The term PLD as used herein will be considered broad enough to include such devices.

PLDs have configuration elements that may be programmed or reprogrammed. Configuration elements may be realized as random access memory ("RAM") bits, flip-flops, electronically erasable programmable read-only memory ("EEPROM") cells, or other memory elements. Placing new data into the configuration elements programs or reprograms the PLD's logic functions and associated routing pathways. Configuration elements that are field programmable are often implemented as RAM cells (sometimes referred to a "configuration RAM" ("CRAM")). However, many types of configurable elements may be used including static or dynamic RAM ("SRAM" or "DRAM"), electrically erasable read-only memory ("EEROM"), flash, fuse, and anti-fuse programmable connections. The programming of configuration elements could also be implemented through mask programming during fabrication of the device. While mask programming may have disadvantages relative to some of the field programmable options already listed, it may be useful in certain high volume applications. For purposes herein, the generic term "configuration element" will be used to refer to any programmable element that may be configured to determine functions implemented by other PLD elements.

PLDs typically include blocks of logic elements, sometimes referred to as logic array blocks ("LABs"; also referred to by other names, e.g., "configurable logic blocks" ("CLBs")). Typically, the basic functional block of a LAB is a logic element ("LE") that is capable of performing logic functions on a number of input variables. LEs, which are sometimes referred to by other names, e.g., "logic cells", may include a look-up table (LUT) or product term, carry-out chain, register, and other elements. PLDs typically combine together large numbers of such LEs through an array of programmable interconnects to facilitate implementation of complex logic functions. LABs (comprising multiple LEs) may be connected to horizontal and vertical conductors that may or may not extend the length of the PLD.

One of the functions implemented by an LE is the addition of binary numbers. It is sometimes desirable to include hardwired adders in the implementation of the adder using the LE. Thus, some LEs include hardwired adders, sometimes also referred to as dedicated adders. Additionally, it is sometimes desirable to add three, rather than only two, binary numbers at once. There are a number of known techniques for adding three or more binary numbers. One of those techniques is the Carry Save Adder method.

FIG. 1 illustrates the concept of Carry Save Adder method. As illustrated in FIG. 1, in the Carry Save Adder method, three binary words, X, Y, and Z, are compressed into sums and carrys output vectors using an array of full adders. In some cases, arrays of independent adders are used to produce the sums and carrys output vectors. Each bit of the sums vector represents the binary sum result of adding the corresponding bits of the binary numbers X, Y, and Z. Each bit of the carrys vector represents the binary carry result of adding the corresponding bits of the binary numbers X, Y, and Z. Thereafter, the carrys vector is shifted to the left by one bit, thus effectively multiplying it by 2. The sums and the shifted carrys are also referred to as the 3:2 compressor results. The sums vector and the shifted carrys vector are then added to generate the final output, which is also referred to as the total in FIG. 1. In FIG. 1, the decimal equivalents of the binary numbers X, Y, Z, as well as the sums, carrys, and total are shown to the right of their corresponding binary numbers.

The addition of three binary numbers requires a larger number of inputs to the LE. Sometimes, an LE does not include enough input terminals to support the addition of three binary numbers using dedicated adders. The present invention addresses this issue.

SUMMARY OF THE INVENTION

In one aspect, an embodiment of the present invention provides LEs that support the addition of three binary numbers using hardwired adders. In one embodiment, this is accomplished by using a 3:2 compressor (i.e., a Carry Save Adder method), using hardwired adders to add the sums and carrys produced by the 3:2 compression, and sharing carrys data calculated in one LE with the following LE. In such an embodiment, with the exception of the first and last LEs in a LAB, each LE in effect lends one LUT to the LE below (i.e., the following LE) and borrows one LUT from the LE above (i.e., the previous LE). The first LE in a LAB in effect lends one LUT to the LE below, but does not borrow a LUT. The last LE in a LAB in effect borrows one LUT from the LE above, but does not lend a LUT. The LUT being lent or borrowed is one that implements the carry function in the 3:2 compressor model.

In another aspect, an embodiment of the present invention provides LEs that include selectors to select signals corresponding to the addition of three binary numbers mode.

The ability to add three binary numbers at a time allows converting an adder tree from binary to ternary. Ternary adder trees exhibit lower depth, logarithmic in base 3 rather than 2. Decreasing the depth tends to improve circuit speed. Ternary adder trees also require approximately half as many nodes as equivalent binary adder trees. Thus, the ability to add three binary numbers results in approximately 50% area savings and 33% depth savings over the traditional binary adder tree when implementing adder trees. The reduction in node count translates into a reduction in the chip area required to implement the circuit.

BRIEF DESCRIPTION OF THE DRAWINGS

The novel features of the invention are set forth in the appended claims. However, for purpose of explanation, several aspects of a particular embodiment of the invention are described by reference to the following figures.

DETAILED DESCRIPTION OF THE INVENTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

As noted above, the Carry Save Adder method is a known method. However, it has not yet been implemented in a PLD using hardwired adders to add the sums and shifted carrys to produce the final result. In the present invention, the Carry Save Adder method is implemented using a hardwired adder to add the sums and shifted carrys. Moreover, some carrys from one LE are shared with the following LE. This is illustrated in the following figures. In the present invention, carrys are shifted relative to the sums in the sense that an n-th carry bit is added to an (n+1)-th sum bit, where n is an integer.

Figure 1:
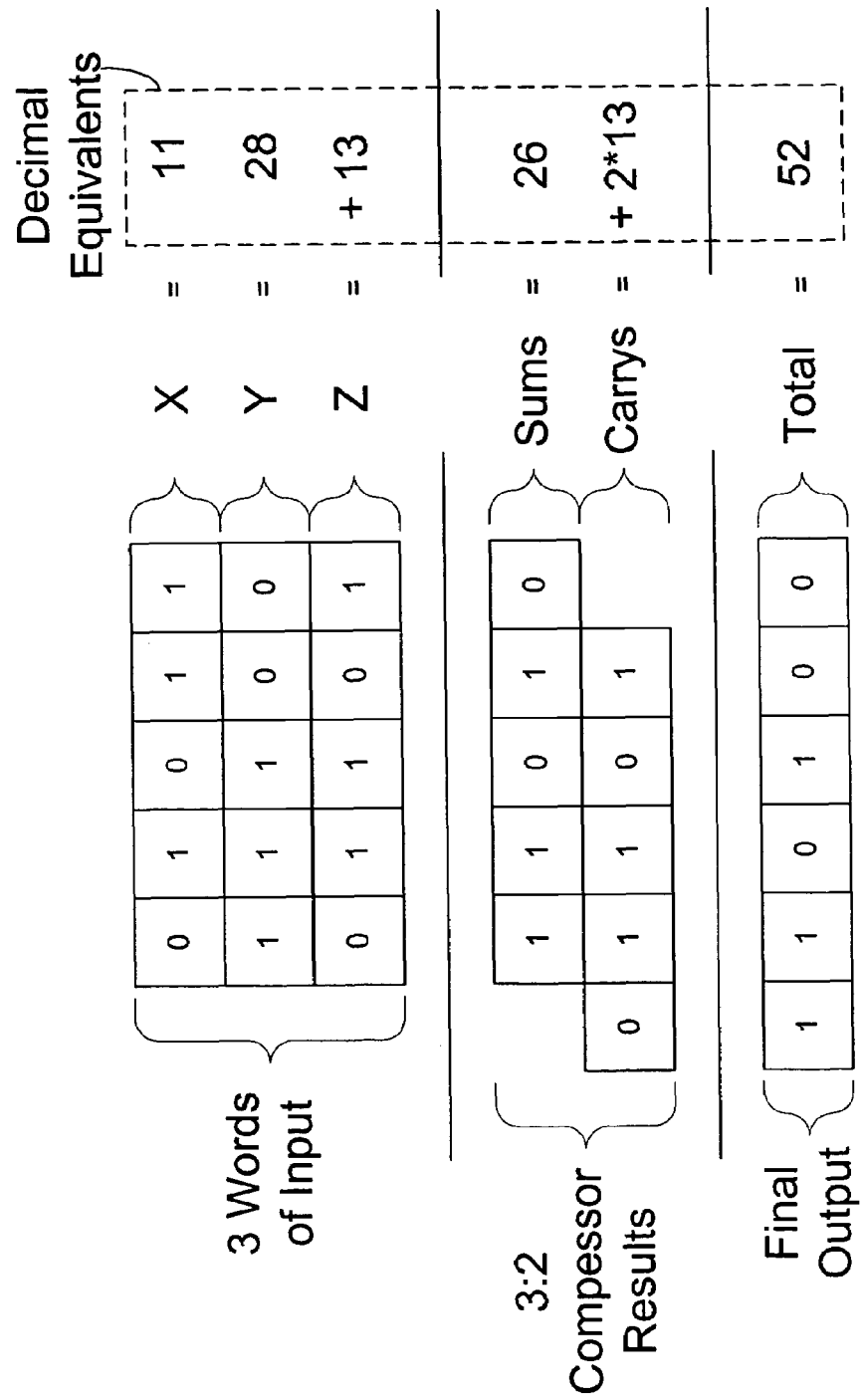
FIG. 1 illustrates the concept of the Carry Save Adder method.
Figure 2A:
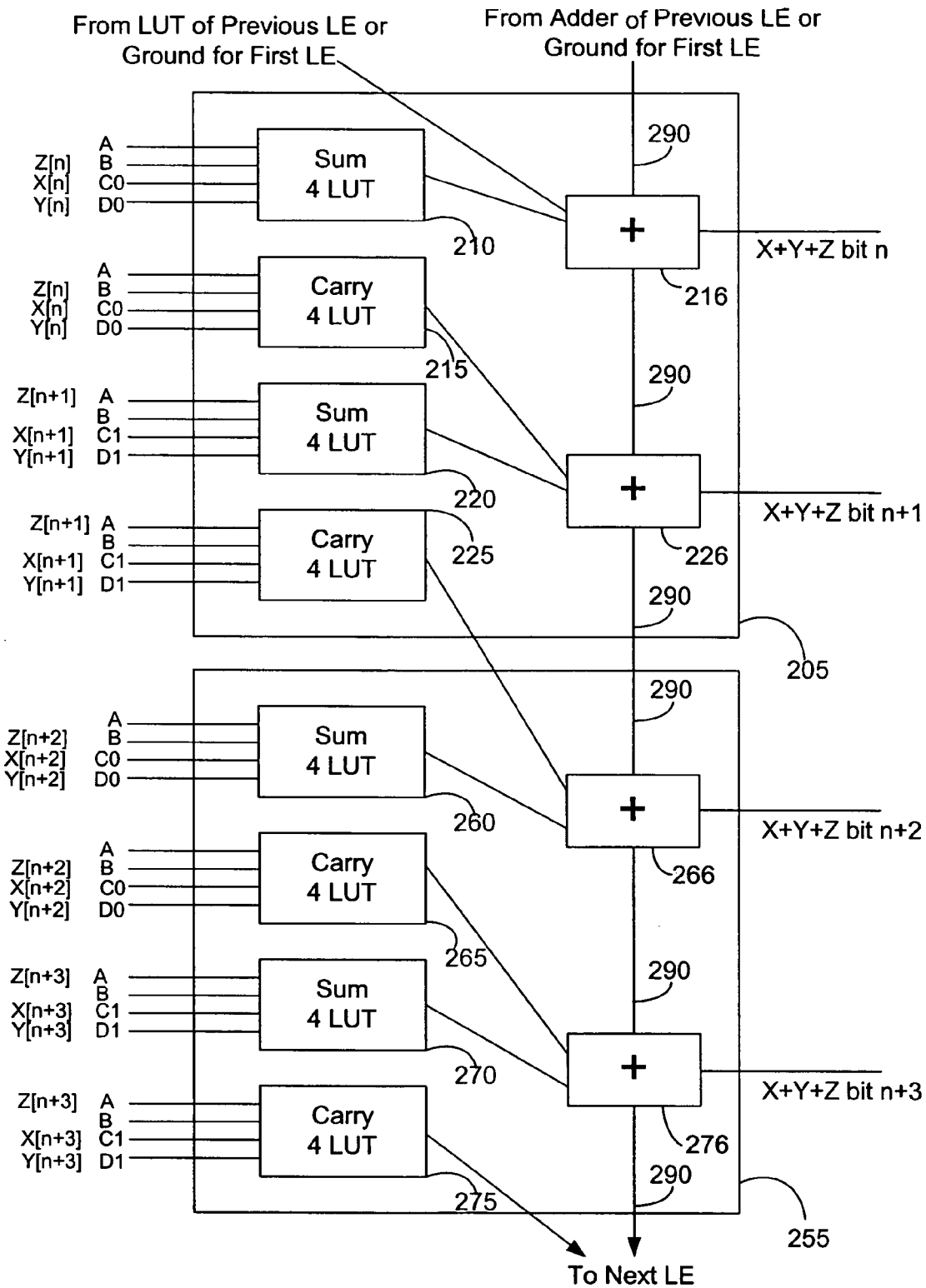
FIG. 2A is a block diagram of two LEs of the present invention.

FIG. 2A is a block diagram of two LEs of the present invention. In FIG. 2A, LE 205 includes LUTs 210, 215, 220, and 225. Additionally, it includes adders 216 and 226. Similarly, LE 255 includes LUTs 260, 265, 270, and 275. Additionally, it includes adders 266 and 276. In one embodiment, adders 266 and 276 are hardwired adders.

LUTs 210 and 215 provide the sums and carrys results for the n-th bit of the binary numbers X, Y, and Z. In other words, they provide the sums and carrys results for the X[n], Y[n], and Z[n] bits. LUTs 220 and 225 provide the sums and carrys results for the (n+1)-th bit of the binary numbers X, Y, and Z. In other words, they provide the sums and carrys results for the X[n+1], Y[n+1], and Z[n+1] bits. LUTs 260 and 265 provide the sums and carrys results for the (n+2)-th bit of the binary numbers X, Y, and Z. In other words, they provide the sums and carrys results for the X[n+2], Y[n+2], and Z[n+2] bits. LUTs 270 and 275 provide the sums and carrys results for the (n+3)-th bit of the binary numbers X, Y, and Z. In other words, they provide the sums and carrys results for the X[n+3], Y[n+3], and Z[n+3] bits.

Adder 216 receives data from LUT 210. If LE 205 is the first LE in a LAB, then adder 216 also receives ground signals. Otherwise, if LE 205 is not the first LE in a LAB, then adder 216 receives the output signals of a carry LUT (i.e., a LUT that determines the carrys for the (n−1)-th bit). Additionally, if n is not the first bit to be output as a result of adding X, Y, and Z, then adder 216 also receives a carry over signal from the previous LE. The carry over signal is received on line 290, which is part of the carry chain for adders 216, 226, 266, and 276. If n is the first bit to be output as a result of adding X, Y, and Z, then adder 216 would receive a ground signal on line 290. Adder 216 outputs the final result for the n-th bit. It also outputs a carry over signal that is sent to adder 226 via line 290.

Adder 226 receives data from LUTs 215 and 220. In other words, it receives the carrys for the n-th bit and the sums for the (n+1)-th bit. Moreover, adder 226 receives the carry over signal from adder 216 via line 290. Adder 226 outputs the final result for the (n+1)-th bit. It also outputs a carry over signal that is sent to adder 266 via line 290.

Adder 266 receives data from LUTs 225 and 260. In other words, it receives the carrys for the (n+1)-th bit and the sums for the (n+2)-th bit. Moreover, adder 266 receives the carry over signal from adder 226 via line 290. Adder 266 outputs the final result for the (n+2)-th bit. It also outputs a carry over signal that is sent to adder 266 via line 290.

Adder 276 receives data from LUTs 265 and 270. In other words, it receives the carrys for the (n+2)-th bit and the sums for the (n+3)-th bit. Moreover, adder 266 receives the carry over signal from adder 266 via line 290. Adder 276 outputs the final result for the (n+3)-th bit. It also outputs a carry over signal that is sent to the first adder in the next LE via line 290.

As can be seen in FIG. 2A, the output of LUT 275 is not used by either LE 205 or LE 255. Instead, the output of LUT 275, which is the carrys for the (n+3)-th bit are shared with the LE following LE 255.

Each of the Sum LUTs, such as LUTs 210, 220, 260, and 270, receives one bit of data from each of the binary numbers X, Y, and Z, and outputs a one bit signal that represents the sum of the three bits received. For example, LUT 210 receive the n-th bit of the binary numbers X, Y, and Z and outputs the sum of those three bits. In other words, it receives the bits X[n], Y[n], and Z[n] and outputs X[n](XOR)Y[n](XOR)Z[n], where XOR represents the Boolean exclusive OR function.

Figure 2B:
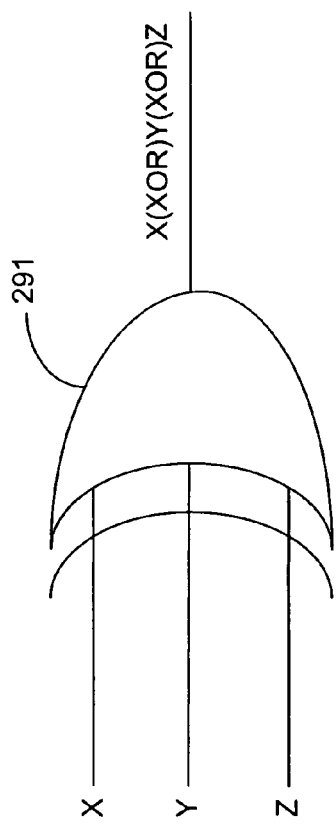
FIG. 2B illustrates an exemplary logic circuit that performs the function of a Sum LUT shown in FIG. 2A.

FIG. 2B illustrates an exemplary logic circuit that performs the function of a Sum LUT that receives the binary numbers X, Y, and Z, and outputs X(XOR)Y(XOR)Z in response thereto. As can be seen in FIG. 2B, inputs signals X, Y, and Z are XOR-ed by the XOR gate 291, which outputs the signal X(XOR)Y(XOR)Z. It is to be noted that other logical circuits may also perform the function of receiving three binary bits and outputting the sum thereof.

Each of the Carry LUTs, such as LUTs 215, 225, 265, and 275, receives one bit of data from each of the binary numbers X, Y, and Z, and outputs a one bit signal that represents the carry resulting from adding the three bits received. For example, LUT 215 receive the n-th bit of the binary numbers X, Y, and Z and outputs the carry resulting from adding those three bits. In other words, it receives the bits X[n], Y[n], and Z[n] and outputs (X[n](AND)Y[n])(OR)(X[n](AND)Z[n]) (OR)(Y[n](AND)Z[n]), where AND represents the Boolean AND function, and OR represents the Boolean OR function.

Figure 2C:
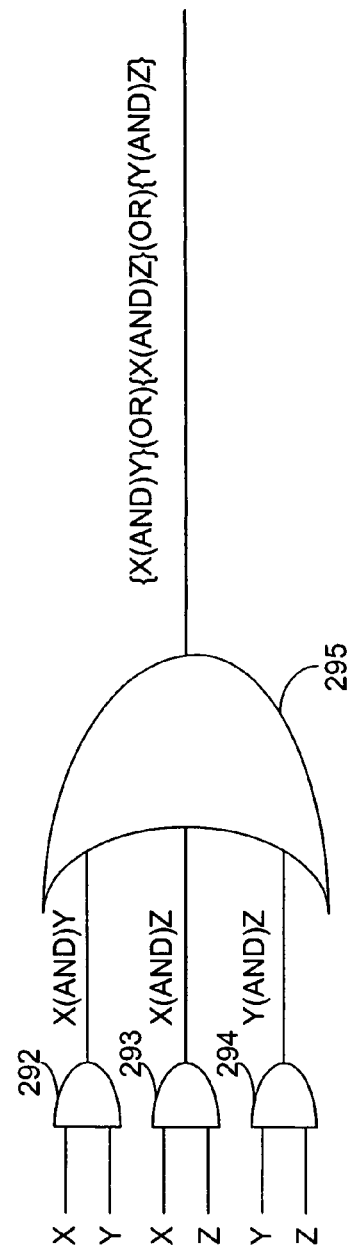
FIG. 2C illustrates an exemplary logic circuit that performs the function of a Carry LUT shown in FIG. 2A.

FIG. 2C illustrates an exemplary logic circuit that performs the function of a Carry LUT that receives the binary numbers X, Y, and Z, and outputs (X(AND)Y)(OR)(X(AND)Z)(OR) (Y(AND)Z) in response thereto. As can be seen in FIG. 2C, AND gate 292 receives X and Y and outputs the result X(AND)Y. The AND gate 293 receives X and Z and outputs the result X(AND)Z. The AND gate 294 receives Y and Z and outputs the result Y(AND)Z. The OR gate 295 receives outputs of AND gates 292, 293, and 294, and outputs the signal {X(AND)Y}(OR){X(AND)Z}(OR){Y(AND)Z} in response thereto. It is to be noted that other logical circuits may also perform the function of receiving three binary bits and outputting the carry resulting from adding those bits.

It is to be noted that the carry over signals that are determined by adders 216, 226, 266, and 276 and carried on line 290 are not the same as the carry signals determined in LUTs 215, 225, 265, and 275, which are also herein referred to as a share carry signals. The carry over signal is the carry signal resulting from adding the signals input to the adder. For example, the carry over signal output by adder 226 is the carry signal resulting from adding the signals received from LUTs 215 and 220 and from adder 216 via line 290. The share carry signal is the carry signal in the Carry Adder Save process. It is the carry result of adding the binary numbers X, Y, and Z.

In one embodiment, each of adders 216, 226, 266, and 276 may be implemented using logic circuits such as those shown in FIGS. 2B and 2C. The three input signals to the adder would be provided to both of the logic circuits. One logic circuit, such as that shown in FIG. 2B, would output the sum of the three input signals. That sum would represent the one bit sum of the corresponding bits of the numbers X, Y, and Z and would be provided as an output of the LE. The other logic circuit, such as that shown in FIG. 2C, would output the carry resulting from adding the three input signals. The carry signal would be provided to the following adder on line 290 as a carry over signal. It is to be noted that when logic circuits, such as those shown in FIGS. 2B and 2C, are used in an adder, such as for example, adder 216, the input signals to the logic circuits are not X, Y, and Z. Instead, they are the three input signals that adder 216 receives as shown in FIG. 2A and described above. It is also to be noted that other logic circuits, besides those shown in FIGS. 2B and 2C, may be used to perform the function of adding three bits of numbers and providing their sum and carry results.

Figure 3:
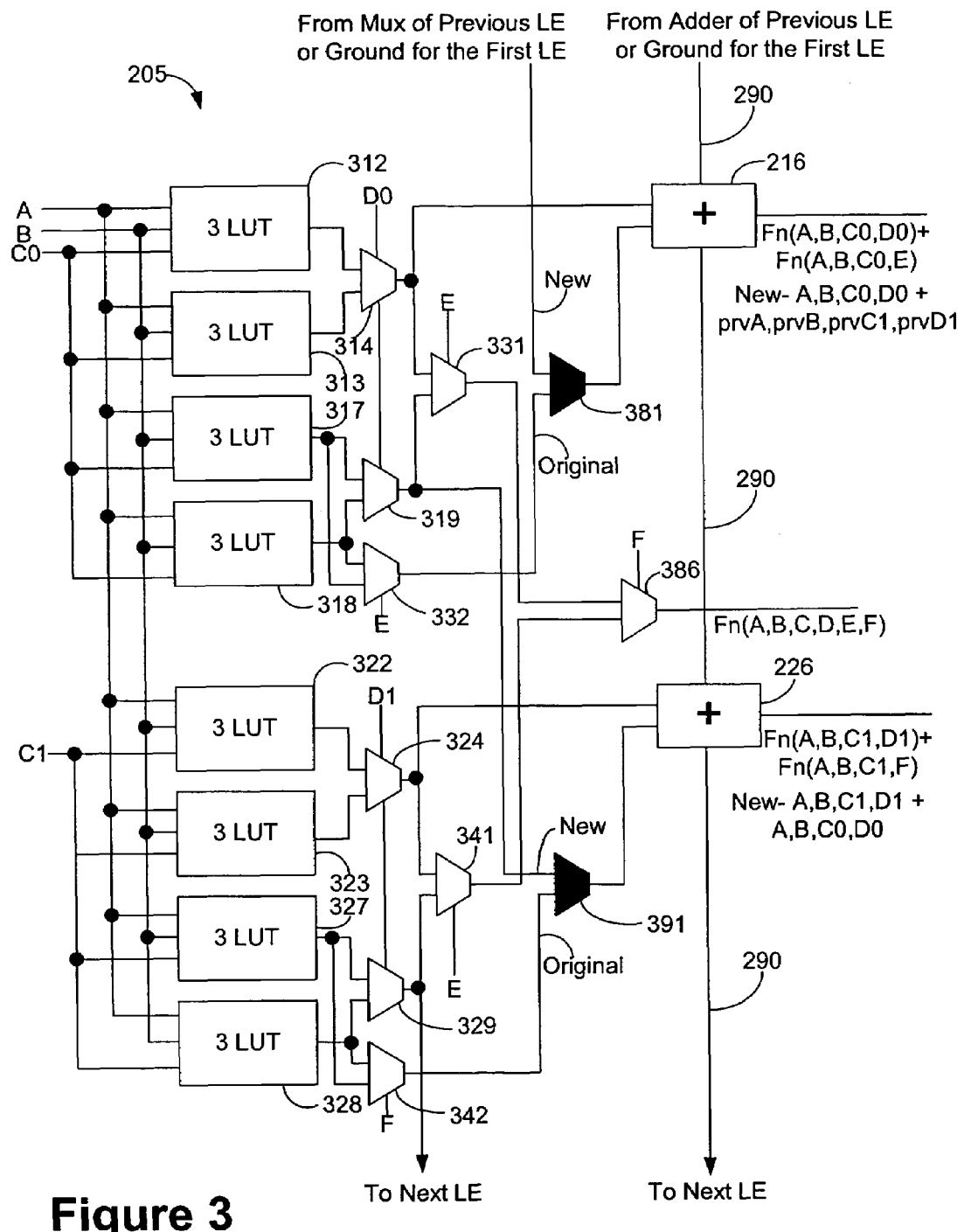
FIG. 3 is a more detailed block diagram of an LE of the present invention.

FIG. 3 is a more detailed block diagram of an LE 205 of the present invention. In FIG. 3, LUTs 312 and 313 in conjunction with multiplexer 314 correspond to LUT 210. Those skilled in the art know that two 3 input LUTs (such as LUTs 312 and 313) in combination with a 2:1 multiplexer (such as multiplexer 314) are functionally the same as a 4 input LUT (such as LUT 210). LUTs 317 and 318 in conjunction with multiplexer 319 correspond to LUT 215. LUTs 322 and 323 in conjunction with multiplexer 324 correspond to LUT 220. LUTs 327 and 328 in conjunction with multiplexer 329 correspond to LUT 225. Multiplexers 314 and 319 receive the signal D0 as a select signal. Multiplexers 324 and 329 receive the signal D1 as a select signal.

LE 205 in FIG. 3 also includes multiplexers 331, 332, 341, 342, 381, 386, and 391. The input terminals of multiplexer 331 are coupled to the output terminals of multiplexers 314 and 319. Multiplexer 331 receives the signal E as a select signal. Using select signal E, multiplexer 331 selects as an output signal one of the two input signals that it receives, i.e., the output signals of multiplexers 314 and 319. The input terminals of multiplexer 332 are coupled to the output terminals of LUTs 317 and 318. Multiplexer 332 receives the signal E as a select signal. Using select signal E, multiplexer 332 selects as an output signal one of the two input signals that it receives, i.e., the output signals of LUTs 317 and 318.

The input terminals of multiplexer 341 are coupled to the output terminals of multiplexers 324 and 329. Multiplexer 341 receives the signal E as a select signal. Using select signal E, multiplexer 341 selects as an output signal one of the two input signals that it receives, i.e., the output signals of multiplexers 324 and 329. The input terminals of multiplexer 342 are coupled to the output terminals of LUTs 327 and 328. Multiplexer 342 receives the signal F as a select signal. Using select signal F, multiplexer 342 selects as an output signal one of the two input signals that it receives, i.e., the output signals of LUTs 327 and 328.

Multiplexer 381 receives the output signal of multiplexer 332 on an original input terminal and a shared signal from the previous LE on a new input terminal. Multiplexer 391 receives the output signal of multiplexer 319 on a new input terminal and the output signal of multiplexer 342 on an original input terminal. When the LE is set to operate in the addition of three binary numbers mode, each of multiplexers 381 and 391 is set to select the input signal that it receives on its new input terminal. In other words, multiplexer 381 selects as an output signal the shared signal it receives from the multiplexer of the previous LE and multiplexer 391 selects as an output signal the signal that it receives from the multiplexer 319. When the LE is not set to operate in the addition of three binary numbers mode, as, for example, when it is set to operate in the addition of two binary numbers mode or a non-arithmetic mode, then each of multiplexers 381 and 391 is set to select the input signal that it receives on its original input terminal. In other words, multiplexer 381 selects as an output signal the signal that it receives from multiplexer 332, and multiplexer 391 selects as an output signal the signal that it receives from the multiplexer 342.

The output terminals of multiplexers 381 and 391 are coupled to adders 216 and 226, respectively. Thus, adder 216 receives the output signal of multiplexer 381 as an input signal and adder 226 receives the output signal of multiplexer 391 as an input signal. Adder 216 also receives the output signal of multiplexer 314 and a signal on line 290. The signal that adder 216 receives on line 290 is either a carry over signal from a previous LE or a ground signal if LE 205 outputs the first bit resulting from adding the binary numbers X, Y, and Z. Adder 226 also receives the output signal of multiplexer 324 and a signal on line 290. The signal that adder 226 receives on line 290 is the carry over signal from adder 216.

When multiplexer 381 selects the input signal that it receives on the new input terminal, then the output signal of adder 216 is Fn(A,B,C0,D0)+Fn(A,B,C0,E). In other words, the output signal is the sum of (1) a function of the input signals received on terminals A, B, C0, D0 and (2) a function of the input signals received on terminals A, B, C0, E. When multiplexer 381 selects the input signal that it receives on the original input terminal, then the output signal of adder 216 is A,B,C0,D0 and prvA,prvB,prvC1,prvD1. In other words, the output signal is the sum of (1) the signals received on terminals A, B, C0, D0 and (2) the signals received on the A, B, C1, and D1 terminals of the LE preceding LE 205.

When multiplexer 391 selects the input signal that it receives on the new input terminal, then the output signal of adder 226 is Fn(A,B,C1,D1)+Fn(A,B,C1,F). In other words, the output signal is the sum of (1) a function of the input signals received on terminals A, B, C1, D1 and (2) a function of the input signals received on terminals A, B, C1, F. When multiplexer 391 selects the input signal that it receives on the original input terminal, then the output signal of adder 226 is A,B,C1,D1 and A,B,C0,D0. In other words, the output signal is the sum of (1) the signals received on terminals A, B, C1, D1 and (2) the signals received on the terminals A, B, C0, and D0 of LE 205.

It is to be noted that in one embodiment, LE 205 may be used for the addition of three binary numbers without including multiplexers 381 and 391. For example, the terminal on which the shared input signal is received may be hardwired to an input terminal of the adder 216. Similarly, the output terminal of multiplexer 319 may be hardwired to an input terminal of the adder 226. Such an embodiment would allow saving the die area that would otherwise be occupied by multiplexers 381 and 391. It would also save the die area that would otherwise by occupied by the 1-bit RAM for providing the select signal to multiplexers 381 and 391. Finally, it would save the die area that would otherwise by occupied by multiplexers 332 and 342. Also, in such an embodiment, the output signals of adders 216 and 226 are the same as those described above when multiplexers 381 and 391 select the signals received on the new input terminals.

The input terminals of multiplexer 386 are coupled to the output terminals of multiplexers 331 and 341. Multiplexer 386 receives the F signal as a select signal. Using the F signal, multiplexer 386 selects as an output signal one of the two signals that it receives as input signals (i.e., the output signals of multiplexers 331 and 341). The output signal of multiplexer 386 is Fn(A,B,C,D,E,F). In other words, it is a function of the signals received on terminals A, B, C, D, E, and F of LE 205.

The output signal of multiplexer 329 is provided to the next LE, i.e., LE 255 (shown in FIG. 2A). More specifically, it is provided as an input signal to hardwired adder 266 in LE 255 (both of which are shown in FIG. 2A). The output signal of multiplexer 329 is a shared carry signal.

As shown in FIG. 2A, each LE outputs two bits of data resulting from adding the binary numbers X, Y, and Z. As further shown in FIG. 3, in addition to the two adder outputs, i.e., the outputs of adders 216 and 226, LE 205 also outputs a signal Fn(A,B,C,D,E,F) that is a logical function of the input signals A, B, C, D, E, and F.

Figure 4:
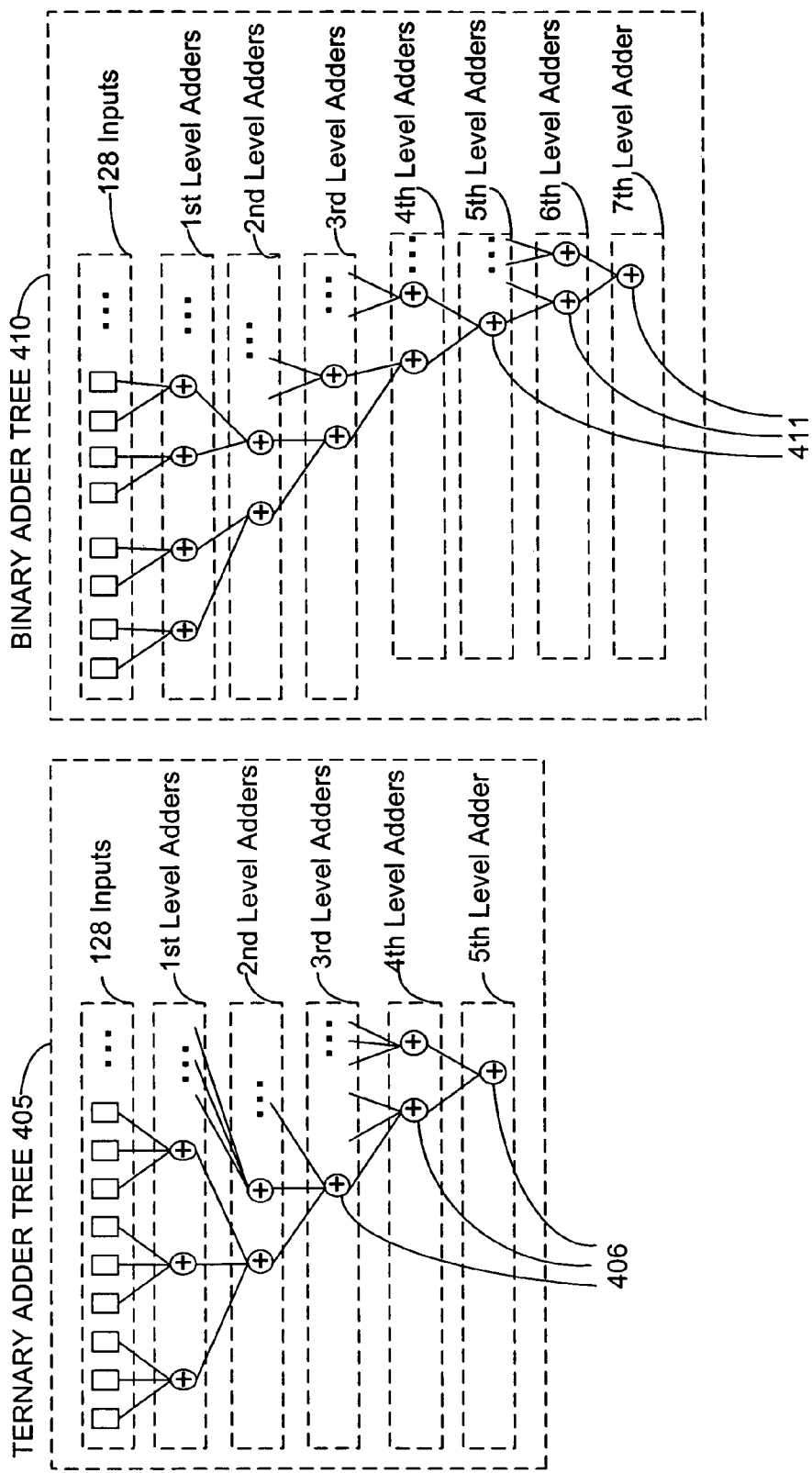
FIG. 4 is a schematic diagram illustrating some benefits of using a ternary adder tree instead of a binary adder tree.

FIG. 4 is a schematic diagram illustrating, by way of example, the benefits of using a ternary adder tree 405 (where each adder adds three binary numbers) instead of a binary adder tree 410 (where each adder adds two binary numbers). In the example of FIG. 4, there are 128 binary numbers that are to be added. The addition of 128 binary numbers may, for example, occur in a large finite input response ("FIR") filter. In the example shown in FIG. 4, in the case of the binary adder tree 410, there are seven levels of adders and 127 adders 411 (not all of which are shown in FIG. 4) required to produce a result. By contrast, in the case of the ternary adder tree 405, there are 5 levels of adders and 64 adders 406 (not all of which are shown in FIG. 4) required to produce a result. Thus, using a ternary adder tree, instead of a binary adder tree, results in an approximately 50% reduction in the number of adders needed. This reduces the chip area required to implement the adder tree by approximately 50%. The reduction in the number of adder levels increases the speed with which the 128 binary numbers can be added. In the example of FIG. 4, the ternary adder tree 405 provides an approximately 33% improvement in speed over the binary adder tree 410.

The adder tree accounts for the bulk of digital signal processing ("DSP") applications such as FIR filters as well as appearing in multipliers and general arithmetic logic. This makes the area savings attractive for common classes of circuits.

Those skilled in the art will recognize that adders 406 or 411 are not the same as adders 216, 226, 266, or 276 (shown in FIGS. 2 and 3). Instead, each of adders 406 includes a combination of LUTs, multiplexers, and hardwired adders used to implement an adder for adding three binary numbers. Similarly, each of adders 411 includes LUT(s), multiplexer (s), and/or hardwired adders needed to implement an adder for adding two binary numbers.

Figure 5:
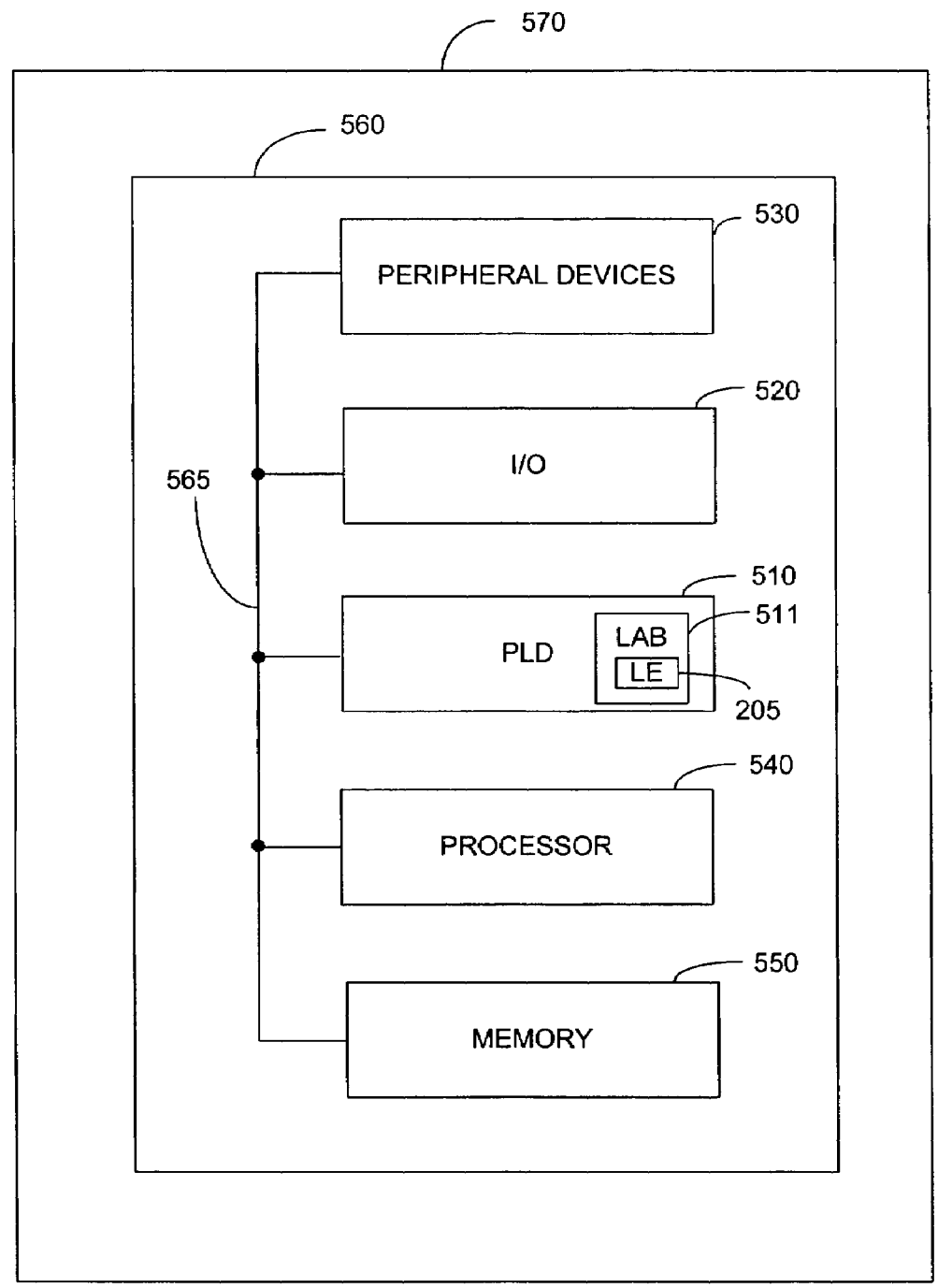
FIG. 5 illustrates an exemplary data processing system including an exemplary PLD in which logic circuits in accordance with the present invention might be implemented.

FIG. 5 illustrates, by way of example, a PLD 510 in a data processing system 500. As one example, logic circuits of this invention may be implemented in LEs of PLDs such as PLD 510. PLD 510 includes a plurality of LABs such as LAB 512 (only one LAB is shown to avoid overcomplicating the drawing). LAB 512 includes a plurality of LEs such as LE 205 (only one LE is shown to avoid overcomplicating the drawing). In one embodiment, LE 205 and LAB 511 are on the same die/chip as PLD 510. Data processing system 500 may include one or more of the following components: a processor 540; memory 550; input/output (I/O) circuitry 520; and peripheral devices 530. These components are coupled together by a system bus 565 and are populated on a circuit board 560 which is contained in an end-user system 570. A data processing system such as system 500 may include a single end-user system such as end-user system 570 or may include a plurality of systems working together as a data processing system.

System 500 can be used in a wide variety of applications, such as computer networking, data networking, instrumentation, video processing, DSP, or any other application where the advantage of using programmable or reprogrammable logic is desirable. PLD 510 can be used to perform a variety of different logic functions. For example, PLD 510 can be configured as a processor or controller that works in cooperation with processor 540 (or, in alternative embodiments, a PLD might itself act as the sole system processor). PLD 510 may also be used as an arbiter for arbitrating access to a shared resources in system 500. In yet another example, PLD 510 can be configured as an interface between processor 540 and one of the other components in system 500. It should be noted that system 500 is only exemplary.

In one embodiment, system 500 is a digital system. As used herein a digital system is not intended to be limited to a purely digital system, but also encompasses hybrid systems that include both digital and analog subsystems.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiment but, on the contrary, is intended to cover various modifications and equivalent arrangements included within the scope of the appended claims.

What is claimed is:

1. A logic circuit comprising:
   a first look-up table (LUT) in a first logic element (LE), wherein the first LUT produces a carry from a first set of corresponding bits of at least three binary numbers; and
   a second LUT in a second LE, wherein the second LUT produces a sum from a second set of corresponding bits of the binary numbers;
   an adder in the second LE, wherein the adder is coupled with the first LUT and the second LUT, and wherein the adder adds the carry and the sum; and
   a multiplexer in the second LE, wherein the multiplexer is coupled to the first LUT and a third LUT in the second LE, further wherein the multiplexer selects between a signal received from the first LUT and a signal received from the third LUT for forwarding to the adder.

2. The logic circuit of claim 1, wherein the adder comprises a hardwired adder.

3. The logic circuit of claim 1, wherein the first LUT determines a 1 bit carry of three binary numbers in a carry save adder process.

4. The logic circuit of claim 1, wherein the first LUT receives bits X[n], Y[n], and Z[n] and provides as an output ((X[n] AND Y[n]) OR (X[n] AND Z[n]) OR (Y[n] AND Z[n])), wherein n is an integer, X[n], Y[n], and Z[n] are the n-th bits of binary numbers X, Y, and Z, further wherein OR designates the Boolean OR function, and AND designates the Boolean AND function.

5. The logic circuit of claim 1, wherein the second LUT determines a 1 bit sum of three binary numbers in a carry save adder process.

6. The logic circuit of claim 1, wherein the second LUT receives bits X[n+1], Y[n+1], and Z[n+1] and provides as an output (X[n+1] XOR Y[n+1]) XOR Z[n+1]), wherein n is an integer, X[n+1], Y[n+1], and Z[n+1] are the (n+1)-th bits of binary numbers X, Y, and Z, further wherein XOR designates the Boolean XOR (exclusive OR) function.

7. A programmable logic device including the logic circuit of claim 1.

8. A digital system comprising a programmable logic device including the logic circuit of claim 1.

9. A logic element (LE) comprising:
a multiplexer; and
an adder coupled to an output of the multiplexer,
wherein the multiplexer selects between a signal determined in the LE and a signal determined in a previous LE for forwarding to the adder, and wherein the multiplexer selects the signal determined in the previous LE when the LE is set to operate in an addition of three binary numbers mode,
wherein the signal determined in the LE is dependent on at least one bit input into the LE on a same input line as one of the three binary numbers, and wherein the multiplexer selects the signal determined in the LE when the LE is not set to operate in an addition of three binary numbers mode.

10. The LE of claim 9, wherein the adder comprises a hardwired adder.

11. The LE of claim 9 further comprising a first logic circuit that determines a sum of an (n+1)-th bit of three binary numbers in a carry save adder process, wherein n is an integer, and wherein the sum of the (n+1)-th bit of three binary numbers is input into the adder.

12. The LE of claim 11, wherein the first logic circuit comprises a look-up table (LUT).

13. The LE of claim 9, wherein the previous LE comprises a second logic circuit that determines a carry of an n-th bit of three binary numbers in a carry save adder process, wherein n is an integer, and wherein the carry is the signal determined in the previous LE.

14. The LE of claim 13, wherein the second logic circuit comprises a look-up table (LUT).

15. A programmable logic device including the LE of claim 9.

16. A digital system comprising a programmable logic device including the LE of claim 9.

17. A programmable logic device (PLD) comprising:
a first logic element (LE), the first LE including:
a first look-up table (LUT), wherein the first LUT determines a first sum;
a second LUT, wherein the second LUT determines a first carry;
a third LUT, wherein the third LUT determines a second sum;
a fourth LUT, wherein the fourth LUT determines a second carry;
a first hardwired adder, wherein the first hardwired adder receives the first sum from the first LUT and a carry from a LUT of a previous LE or ground signals; and
a second hardwired adder, wherein the second hardwired adder receives the first carry and the second sum; and
a second LE, the second LE including:
a fifth LUT, wherein the fifth LUT determines a third sum;
a sixth LUT, wherein the sixth LUT determines a third carry;
a seventh LUT, wherein the seventh LUT determines a fourth sum;
an eighth LUT, wherein the eighth LUT determines a fourth carry;
a third hardwired adder, wherein the third hardwired adder receives the third sum determined by the fifth LUT and the second carry determined by the fourth LUT; and
a fourth hardwired adder, wherein the fourth hardwired adder receives the fourth sum and the third carry,
wherein:
the first LE further comprises:
a first multiplexer having first and second input terminals and a first output terminal, wherein the first input terminal is coupled to one of ground signals or an output of the LUT of the previous LE, the second input terminal is coupled to a first output terminal of the second LUT, and the first output terminal is coupled to the first hardwired adder; and
a second multiplexer having third and fourth input terminals and a second output terminal, wherein the third input terminal is coupled to a second output terminal of the second LUT, the fourth input terminal is coupled to a first output terminal of the fourth LUT, and the second output terminal is coupled to the second hardwired adder; and
the second LE further comprises:
a third multiplexer having fifth and sixth input terminals and a third output terminal, wherein the fifth input terminal is coupled to a second output terminal of the fourth LUT, the sixth input terminal is coupled to a first output terminal of the sixth LUT, and the third output terminal is coupled to the third hardwired adder; and
a fourth multiplexer having seventh and eighth input terminals and a fourth output terminal, wherein the seventh input terminal is coupled to a second output terminal of the sixth LUT, the fourth input terminal is coupled to a first output terminal of the eighth LUT, and the fourth output terminal is coupled to the fourth hardwired adder.

18. The PLD of claim 17, wherein the first sum, the first carry, the second sum, the second carry, the third sum, the third carry, the fourth sum, and the fourth carry, are sums and carrys in a carry save adder process.

19. A digital system including the PLD of claim 17.

20. A method of operating a programmable logic device to add at least three binary numbers having multiple bits, the method comprising:
receiving a first set of corresponding bits of the binary numbers at a first look-up table (LUT) of a first logic element (LE);
producing a carry from the first LUT and sending the carry to a multiplexer;
receiving a second set of corresponding bits of the binary numbers at a second LUT of a second LE;
producing a sum from the second LUT;
selecting, with the multiplexer, between the carry received from the first LUT and a signal received from a third LUT in the second LE for forwarding to an adder, wherein the multiplexer is coupled to the first LUT and the third LUT;

receiving, at the adder, the carry and the sum;

adding the carry produced by the first LUT of the first LE with the sum produced by the second LUT of the second LE to obtain at least part of a total sum of the binary numbers; and outputting the at least part of the total sum of the binary numbers from the adder.

21. The method of claim 20, wherein the determining the carry includes determining a 1 bit carry of three binary numbers in a carry save adder process.

22. The method of claim 21, wherein the determining the carry includes:

receiving bits X[n], Y[n], and Z[n]; and determining ((X[n] AND Y[n]) OR (X[n] AND Z[n]) OR (Y[n] AND Z[n])), wherein n is an integer, X[n], Y[n], and Z[n] are the n-th bits of binary numbers X, Y, and Z, further wherein OR designates the Boolean OR function, and AND designates the Boolean AND function.

23. The method of claim 20, wherein the determining the sum includes determining a 1 bit sum of three binary numbers in a carry save adder process.

24. The method of claim 23, wherein the determining the sum includes:

receiving bits X[n+1], Y[n+1], and Z[n+1]; and determining (X[n+1] XOR Y[n+1]) XOR Z[n+1]), wherein n is an integer, X[n+1], Y[n+1], and Z[n+1] are the (n+1)-th bits of binary numbers X, Y, and Z, further wherein XOR designates the Boolean XOR (exclusive OR) function.

25. The method of claim 20, further comprising:

receiving, at the adder, a carry over signal from another adder; and adding the carry over signal to the carry and the sum to obtain the at least part of a total sum of the binary numbers.

26. The method of claim 20 wherein producing a carry by the first LUT uses only the first set of corresponding bits.

* * * * *